United States Patent [19]
Hertz et al.

[11] Patent Number: 5,381,307
[45] Date of Patent: Jan. 10, 1995

[54] SELF-ALIGNING ELECTRICAL CONTACT ARRAY

[75] Inventors: Allen D. Hertz, Boca Raton; David A. Tribbey, Boynton Beach; Kenneth R. Thompson, Sunrise, all of Fla.

[73] Assignee: Motorola, Inc., Schaumburg, Ill.
[21] Appl. No.: 129,010
[22] Filed: Sep. 29, 1993

Related U.S. Application Data

[63] Continuation of Ser. No. 901,000, Jun. 19, 1992, abandoned.
[51] Int. Cl.$^6$ .......................... H05K 7/10; H05K 7/02
[52] U.S. Cl. ................................ 361/767; 228/179.1; 228/180.1; 228/180.21; 228/180.22; 257/700; 257/778; 257/779; 361/760; 361/768; 361/772; 361/773; 361/774; 361/777; 361/808; 437/209
[58] Field of Search ........................ 29/832, 840, 842; 174/260, 261, 263; 228/180.21, 180.22; 257/690, 692, 694–696, 723, 737, 738, 773, 775, 777, 778, 779; 361/751, 760, 767, 768, 772, 777, 807, 808; 439/68–73, 83

[56] References Cited

U.S. PATENT DOCUMENTS

| | | | |
|---|---|---|---|
| 3,871,014 | 3/1975 | King et al. | 228/180.22 |
| 4,032,058 | 6/1977 | Riseman | 228/180.2 |
| 4,164,778 | 8/1979 | Sawairi et al. | 361/409 |
| 4,600,970 | 7/1986 | Bauer | 361/768 |
| 4,831,724 | 5/1989 | Elliott | 228/180.2 |
| 4,949,148 | 8/1990 | Bartelink | 357/74 |
| 5,019,673 | 5/1991 | Juskey et al. | 174/52.2 |
| 5,022,580 | 6/1991 | Pedder | 29/834 |

FOREIGN PATENT DOCUMENTS

| | | | |
|---|---|---|---|
| 62-73639 | 4/1987 | Japan | 437/209 |
| 02-43748 | 2/1990 | Japan | 228/180.2 |
| 2-235388 | 9/1990 | Japan | 439/83 |
| 003-4545 | 1/1991 | Japan | 257/777 |
| 3-126238 | 5/1991 | Japan | 228/180.22 |
| WO87/01509 | 3/1987 | WIPO | 228/180.2 |

OTHER PUBLICATIONS

IBM Technical Disclosure Bulletin "Method of Preparation of Controlled Chip Joining" by Bakos et al. vol. 21 No. 9 Feb. 1979.

"BGAs Face Production Testing, New Package Offers Promise but Must Clear Technology Hurdles", by Dave Hattas, Advanced Packaging, Summer 1993, pp. 44 to 46.

"IBM Details Its Ball–Grid Array Push", by Terry Costlow, Electronic Engineering Times, Issue 758, Aug. 9, 1993, pp. 1 and 8.

"SMT, COB and TAB, What to Expect in Design Tradeoffs", by Elliott H. Newcombe, III, Surface Mount Technology, Aug. 1993, pp. 38 to 41.

"IBM and Compaq Endorse BGAs, Update No. 2: Future of Fine Pitch in Doubt", Manufacturing Market Insider, Jul. 1993, pp. 1 to 4.

"Arrayed Against Fine Pitch", *Circuits Assembly*, p. 22, Feb. 1992.

*Primary Examiner*—Leo P. Picard
*Assistant Examiner*—Donald A. Sparks
*Attorney, Agent, or Firm*—D. Andrew Floam; R. Louis Breeden

[57] ABSTRACT

A mounting pad arrangement (FIG. 5) improves reliability of placement of a surface mount component. A first pad array is disposed throughout an area on the surface (308) of a substrate (202), the area having four outside corners. The first pad array includes contact pads (502) arranged in a first linear grid pattern, and eight aligning pads (504,506,510,514,518), larger than the contact pads (502). Two aligning pads (504,506,510,514,518) are near each of the four outside corners. Each aligning pad (504,506,510,514,518) is positioned off center with respect to the first linear grid pattern such that a tangential line (608,610,612,614) can be drawn between an innermost point of the aligning pad (504,506,510,514,518) and corresponding innermost points of the contact pads (502) that are collinear on the first linear grid pattern. A second pad array (406) is disposed on the surface mount component and arranged in a second linear grid pattern that aligns with the first linear grid pattern. Eight pads of the second pad array (406) also align with points of intersection of the first linear grid pattern that fall within each of the eight aligning pads (504,506,510,514,518). Each pad of the second pad array (406) is equal in size to any other pad of the second pad array (406). Solder (312) is disposed between and contacting each pad of the first and second pad arrays.

6 Claims, 5 Drawing Sheets

SELF-ALIGNING ELECTRICAL CONTACT ARRAY

This is a continuation of application Ser. No. 07/901,000 filed on Jun. 19, 1992 now abandoned.

FIELD OF THE INVENTION

This invention relates generally to electronic devices utilizing component surface mount technology, and more particularly to a component mounting arrangement including an array of electrical contacts that is self-aligning for improving the reliability and manufacturability of an electronic device.

BACKGROUND OF THE INVENTION

Modern selective call receivers, e.g., pagers, generally include circuit supporting substrates, e.g., printed circuit boards, with electronic components mounted thereon, such as via surface mount technology. A trend in the market toward overall device miniaturization is driving the need for component device miniaturization. At the same time, there is a trend to increase the number of functions of the component devices, which is driving the need for increasing the number of electrical interconnections between component devices.

The requirement for smaller component device dimensions is in direct conflict with the requirement for increased number of interconnections because the former tends to reduce the available surface area for interconnection while the latter demands more interconnections with the available surface area. That is, on the one hand, smaller component device dimensions increasingly limit the available space for interconnecting component devices, while, on the other hand, increasing the number of interconnections between component devices requires more space, which is not available, for interconnecting the component devices or a finer pitch, i.e., finer resolution, between adjacent interconnections within the available space. Unfortunately, contemporary manufacturing technology has been limited in the minimum pitch that can be used for interconnecting component devices within the available space. Particularly, the placement of component devices on circuit supporting substrates becomes very prone to errors as the pitch of the interconnections approaches the limit of the technology. This creates significant defect problems during manufacturing and increases the cost of the final product. Additionally, the increased number of manufacturing defects reduce the overall reliability and quality of the final delivered product as perceived by the customer.

Thus, what are needed are self-aligning electrical contacts for surface mount interconnection that significantly improve the rreliability of placement of the component devices to reduce the possibility for manufacturing defects even while utilizing a finer pitch that approaches the limit of the technology.

SUMMARY OF THE INVENTION

An aspect of the present invention is a mounting pad arrangement for improved reliability of placement of a surface mount component with respect to the mounting pad arrangement. The mounting pad arrangement comprises a circuit supporting substrate having an interconnection surface, and a first pad array disposed throughout an area of predetermined shape on the interconnection surface, the area having four outside corners. The first pad array comprises a plurality of contact pads arranged in a first linear grid pattern, and eight aligning pads, larger than the contact pads. Two of the aligning pads are positioned proximate each of the four outside corners. Each of the aligning pads is further positioned off center with respect to the first linear grid pattern such that a tangential line can be drawn between an innermost point of the aligning pad and corresponding innermost points of the contact pads that are collinear on the first linear grid pattern. The mounting pad arrangement further comprises a second pad array disposed on the surface mount component and arranged in a second linear grid pattern that aligns with the first linear grid pattern. Eight pads of the second pad array also align with points of intersection of the first linear grid pattern that fall within each of the eight aligning pads. Each pad of the second pad array is equal in size to any other pad of the second pad array. The mounting pad arrangement also includes solder disposed between and contacting each pad of the first and second pad arrays.

Another aspect of the present invention is an electronic device, comprising electronic circuitry for performing functions in the electronic device, and a circuit supporting substrate having an interconnection surface. At least a portion of the electronic circuitry comprises a surface mount component mounted on the interconnection surface. The electronic device further comprises a first pad array for improved reliability of placement of the surface mount component with respect to the first pad array. The first pad array is disposed throughout an area of predetermined shape on the interconnection surface, the area having four outside corners. The first pad array comprises a plurality of contact pads arranged in a first linear grid pattern, and eight aligning pads, larger than the contact pads. Two of the aligning pads are positioned proximate each of the four outside corners. Each of the aligning pads is further positioned off center with respect to the first linear grid pattern such that a tangential line can be drawn between an innermost point of the aligning pad and corresponding innermost points of the contact pads that are collinear on the first linear grid pattern. The electronic device further comprises a second pad array disposed on the surface mount component and arranged in a second linear grid pattern that aligns with the first linear grid pattern. Eight pads of the second pad array also align with points of intersection of the first linear grid pattern that fall within each of the eight aligning pads. Each pad of the second pad array is equal in size to any other pad of the second pad array. The electronic device also includes solder disposed between and contacting each pad of the first and second pad arrays.

Another aspect of the present invention is a selective call receiver, comprising receiver circuitry for receiving transmitted messages, and a decoder electrically coupled to the receiver circuitry for decoding the received messages. The selective call receiver further comprises a presenting element electrically coupled to the decoder for presenting the decoded messages to a user, and a circuit supporting substrate having an interconnection surface. At least a portion of the receiver circuitry, the decoder, and the presenting element includes a surface mount component mounted on the interconnection surface. The selective call receiver further comprises a first pad array that improves reliability of placement of the surface mount component with respect to the first pad array. The first pad array is disposed throughout an area of predetermined shape on the interconnection surface, the area having four outside corners. The first pad array comprises a plurality of contact pads arranged in a first linear grid pattern, and eight aligning pads, larger than the contact pads. Two of the aligning pads are positioned proximate each of the four outside corners. Each of the aligning pads is further positioned off center with respect to the first linear grid pattern such that a tangential line can be drawn between an innermost point of the aligning pad and corresponding innermost points of the contact pads that are collinear on the first linear grid pattern. The selective call receiver further comprises a second pad array disposed on the surface mount component and arranged in a second linear grid pattern that aligns with the first linear grid pattern. Eight pads of the second pad array also align with points of intersection of the first linear grid pattern that fall within each of the eight aligning pads. Each pad of the second pad array is equal in size to any other pad of the second pad array. The selective call receiver also includes solder disposed between and contacting each pad of the first and second pad arrays.

DESCRIPTION OF A PREFERRED EMBODIMENT

Figure 1:
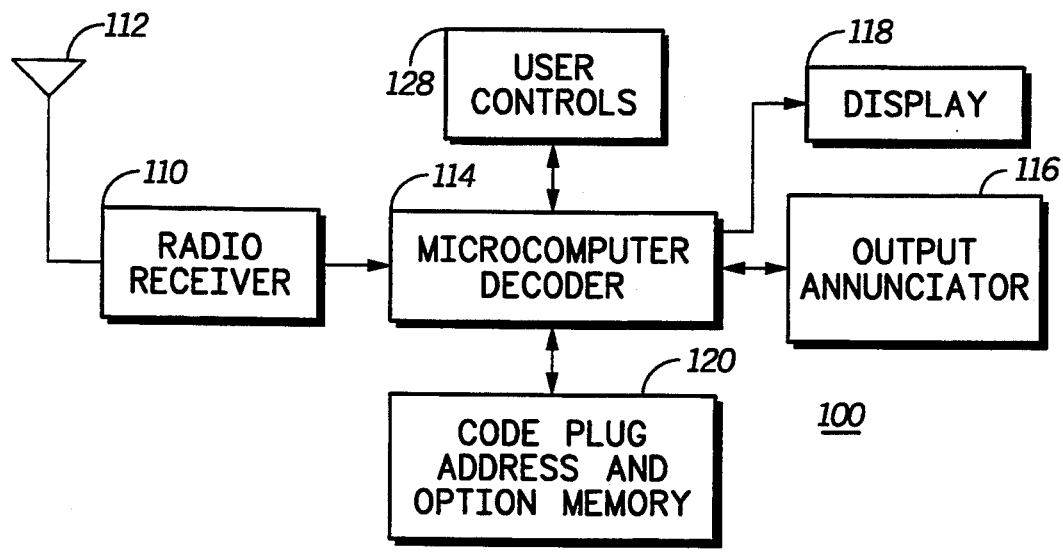
FIG. 1 is a block diagram of a paging receiver, in accordance with the present invention.

FIG. 1 is an electrical block diagram of a selective call receiver, e.g. a pager 100. It includes radio receiver circuitry 110 which receives signals via an antenna 112. The received signals include paging information. Selective call receivers can respond to transmitted information containing various combinations of tone, tone and voice, or data messages in a variety of modes. This information may be transmitted using several paging coding schemes and message formats.

The output of the radio receiver circuitry 110 is applied to a microcomputer decoder 114 which processes the information contained in the received signals, to decode any received message. As can be seen, the microcomputer decoder 114 communicates with an output annunciator 116, such as a transducer or speaker, to alert a user that a message has been received, with a display 118, such as a liquid crystal display (LCD), to present a message via the display 118, and with a code plug address and option memory 120 to retrieve predetermined address and function information. Normally, after a received address matches a predetermined address in the pager 100, the output annunciator 116 alerts the user that a message has been received. The user can activate user controls 128, such as buttons or switches, to invoke functions in the pager 100, and optionally to view the received message on the display 118. The operation of a paging receiver of the general type shown in FIG. 1 is well known and is more fully described in U. S. Pat. No. 4,518,961, issued May 21, 1985, entitled "Universal Paging Device with Power Conservation", which is assigned to the same assignee as the present invention and is incorporated herein by reference.

Figure 2:
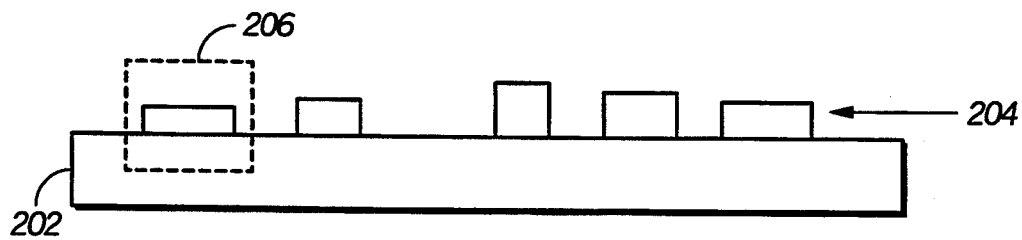
FIG. 2 is a side view of a circuit supporting substrate having surface mount components mounted thereon.

FIG. 2 is a side view of a circuit supporting substrate 202 having surface mount components 204 mounted thereon. These surface mount components 204 may include electrical components 206 for performing functions in an electronic device, such as in the pager 100. Electronic circuitry in the pager 100 may include the electrical components 206 mounted on the circuit supporting substrate 202. The electronic circuitry can perform functions in the pager 100. For example, the electronic circuitry can include at least one of the receiver circuitry 110, the decoder 114, and the display 118. Further, the electronic circuitry comprises the electrical component 206 that is surface mounted on the circuit supporting substrate 202.

Figure 3:
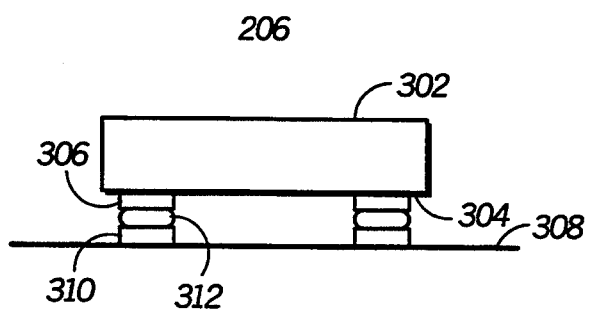
FIG. 3 is a more detailed view of the circuit supporting substrate of FIG. 2.

FIG. 3 illustrates a more detailed view of the surface mounting arrangement of the electrical component 302 to a surface 308 of the circuit supporting substrate 202. Typically, the component 302 has a surface 304 that is substantially opposing the surface 308 of the circuit supporting substrate 202. Pads 306 are disposed on the surface 304 of the component 302 and correspond to pads 310 disposed on the surface 308 of the circuit supporting substrate 202. The pads 306 on the component 302 are paired off with the pads 310 on the circuit supporting substrate 202 in a surface mounting arrangement. Normally, the pads 306 on the component 302 are dimensioned and arranged to at least partially overlap with the pads 310 on the surface 308 of the circuit supporting substrate 202 when the component 302 is aligned to a location on the surface 308 of the circuit supporting substrate 202. When the component 302 is aligned to the location on the surface 308 of the circuit supporting substrate 202 within a tolerance the solder 312 is disposed between the pads 306 on the component 302 and the pads 310 on the surface 308 of the circuit supporting substrate 202. The solder 312, after being reflowed, e.g., after being heated until liquefied, can provide a conductive bonding medium between the component 302 and the circuit supporting substrate 202.

The interconnection of the pads 306 on the component 302 and the pads 310 on the circuit supporting substrate 202 via the solder joints 312 can provide electrical paths for communicating electrical signals between the electrical component 302 and the circuit supporting substrate 202 in a manner well known to those skilled in the art. Due to the increase in complexity of modern electronic devices, such as pagers 100, each component 302 may perform many functions for the electronic device. The more functions that an electronic component 302 performs, typically, requires an increasing number of signal interconnections between the component 302 and the circuit supporting substrate 202. These large groupings of electrical contacts or pads 306 on the component 302, and similarly 310 on the circuit supporting substrate 202, are called pad arrays. These pad arrays can be arranged in a linear grid, or a staggered grid, or in other arrangements as necessary to provide an adequate number of interconnections between the component 302 and the circuit supporting substrate 202.

The electrical component 302 may be surface mounted to the surface 308 of the circuit supporting substrate 202 using surface mount manufacturing technologies. These technologies may include C4, C5, DCA (Direct Chip Attach), SLAM (Single Layer Alumina Metallized) or other ceramic based pad grid arrays, Flip-chip, OMPAC (Over Molded Pad Array Carrier), MCM (Multi Chip Modules), SLICC (Slightly Larger than IC Carrier), LGA (Land Grid Array), and more generically any type of pre-soldered components which are then reflow soldered to a circuit supporting substrate, or conversely the circuit supporting substrate being pre-soldered, or both.

Figure 4:
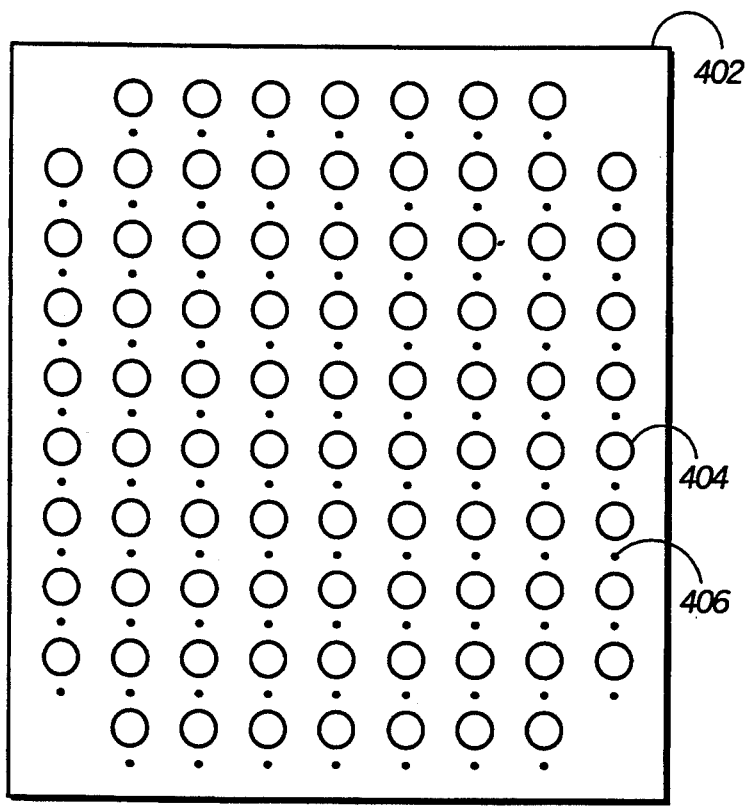
FIG. 4 is a top view of a circuit supporting substrate comprising an array of electrical contacts thereon and illustrating component leads being mislocated relative to the array of electrical contacts.

FIG. 4 is a top view of a surface area 402 of the circuit supporting substrate 302 comprising an array of electrical contacts, e.g., a pad array 404, disposed on the surface area 402. The pad array is indicated by the circular pads 404. Also, an array of component leads 406, i.e., a pad array 406 on the component, is mislocated relative to the array of electrical contacts 404 on the surface area 402 of the circuit supporting substrate 302. The pad array on the component is indicated by the dots 406. The dots 406 can represent the apex point of solder bumps that are pre-applied to the pads on the component. Alternatively, the dots 406 can represent the actual dimension of the pads on the component. The contact points, or alternatively the overlap regions, between the pads 406 on the component and the pads 404 on the circuit supporting substrate 202 help define the alignment of the component to a location 402 on the circuit supporting substrate 202 relative to a tolerance of a placement operation. Where there is no contact or overlap region between the respective pads 404, 406, the solder will not adhere and no bonding will take place between the component and the circuit supporting substrate 202.

This mislocation of the component relative to the location or surface area 402 is typical of a placement error in a manufacturing process. As can be seen, the pad array 404 on the surface area 402 of the circuit supporting substrate 202 is misaligned with the pad array 406 on the component being placed. This misplacement of the component on the circuit supporting substrate 202, as illustrated by the misalignment of the leads 406 relative to the pads 404 can be the result of a number of problems during manufacturing. For example, the misalignment can occur because the tolerance of a placement operation exceeds the tolerance required by the relative spacing or pitch of the pads. That is, the placing operation is not sufficiently accurate for placing the component as required by the spacing between adjacent pads 404, 406, as determined by the pitch and the dimensions of the pads. Additionally, the misalignment can occur as a result of excessive handling or while transporting the circuit supporting substrate 202 from station to station in a manufacturing process.

When a component is misaligned to its required location on the circuit supporting substrate 202 a reflow soldering operation will not be effective. That is, the component will not solder to the circuit supporting substrate 202, and consequently a manufacturing defect is introduced. This of course increases the overall cost of a manufacturing process as well as reduces the overall quality of the final delivered product.

Figure 5:
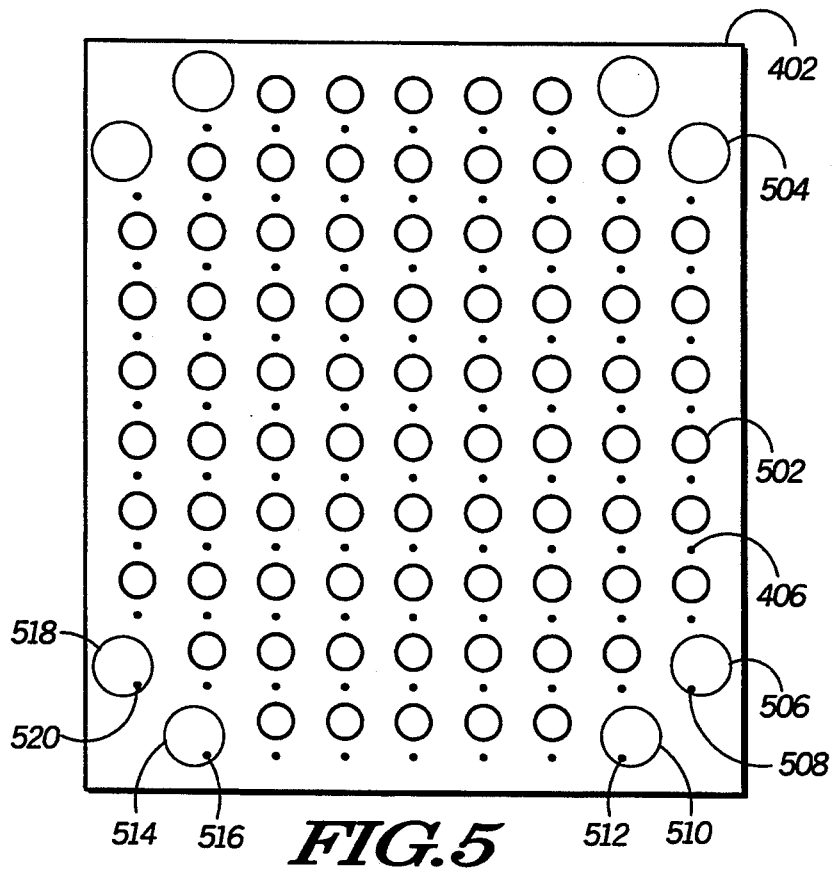
FIG. 5 is a top view of a circuit supporting substrate comprising an array of electrical contacts thereon in a realigning arrangement relative to component leads, according to the preferred embodiment of the present invention.

FIG. 5 is a top view of the surface area 402 of the circuit supporting substrate 202 comprising an array of electrical contacts, e.g., a pad array 502, disposed on the surface area 402 in a realigning arrangement relative to the component leads 406, according to the preferred embodiment of the present invention. As shown, the component is misplaced relative to the placement location as illustrated by the misalignment of the leads 406 relative to the pads 502. Most of the leads 406 do not overlap their corresponding pads 502 on the circuit supporting substrate 202 due to the misalignment. However, four of the leads 508, 512, 516, 520, do overlap with their corresponding pads 506, 510, 514, 518, because in the preferred embodiment a number of the pads have been dimensioned larger than most of the other pads 502 in the pad array on the surface area 402 of the circuit supporting substrate 202. These larger pads are also arranged relative to the respective leads on the component such that even when most of the leads 406 are misaligned with their respective pads 502 the larger aligning pads may at least partially overlap with their corresponding leads within a defined tolerance. By dimensioning and arranging the aligning pads 504 relative to their corresponding leads 406 it assures that at one of the aligning pads 506, 510, 514, 518, will at least partially overlap with its paired lead 508, 512, 516, 520, on the component. Hence, during a reflow soldering operation the solder can flow and adhere to the overlapping exposed metal contacts.

Further, the aligning pads 506, 510, 514, 518, are oriented relative to the leads 508, 512, 516, 520, when at least partially overlapping with each other, such that when the solder is in a liquid state the surface tension of the solder can move the component relative to the circuit supporting substrate 202 to center the at least one partially overlapping pair of pads 506, 510, 514, 518, and leads 508, 512, 516, 520, relative to each other. The surface tension of the liquid solder, therefore, provides an aligning force between the component and the circuit supporting substrate 202 that tends to align the component to the location or surface area 402 on the circuit supporting substrate 202. Therefore, the dimensioning and arrangement of the aligning pads 504 can guarantee that at least one of the aligning pads 506, 510, 514, 518, will at least partially overlap with its paired lead 508, 512, 516, 520, relative to a tolerance of the placement operation which is greater than the tolerance of the placement operation without the aligning pads 506, 510, 514, 518, and leads 508, 512, 516, 520.

Consequently, the component may be placed on the surface area 402 of the circuit supporting substrate 202 relative to the larger tolerance of the placement operation, and then reflow soldered into alignment. During reflow soldering the at least one partially overlapping pair of aligning pads 506, 510, 514, 518, and leads 508, 512, 516, 520, are oriented relative to each other to guide the surface tension of the liquid solder for moving the component relative to the circuit supporting substrate 202. The movement is in the direction for aligning the component to the desired placement location on the circuit supporting substrate 202 relative to the smaller tolerance of the placement operation. This dimensioning and arrangement of the aligning pads 504 relative to the leads 406 on the component allow placement of the component using the more relaxed tolerance of the placement operation, and then the reflow soldering operation aligns the component relative to the tighter tolerance until the smaller pads 502 and leads 406 (or contact points therebetween) at least partially overlap with each other, as will be more fully discussed below.

Figure 6:
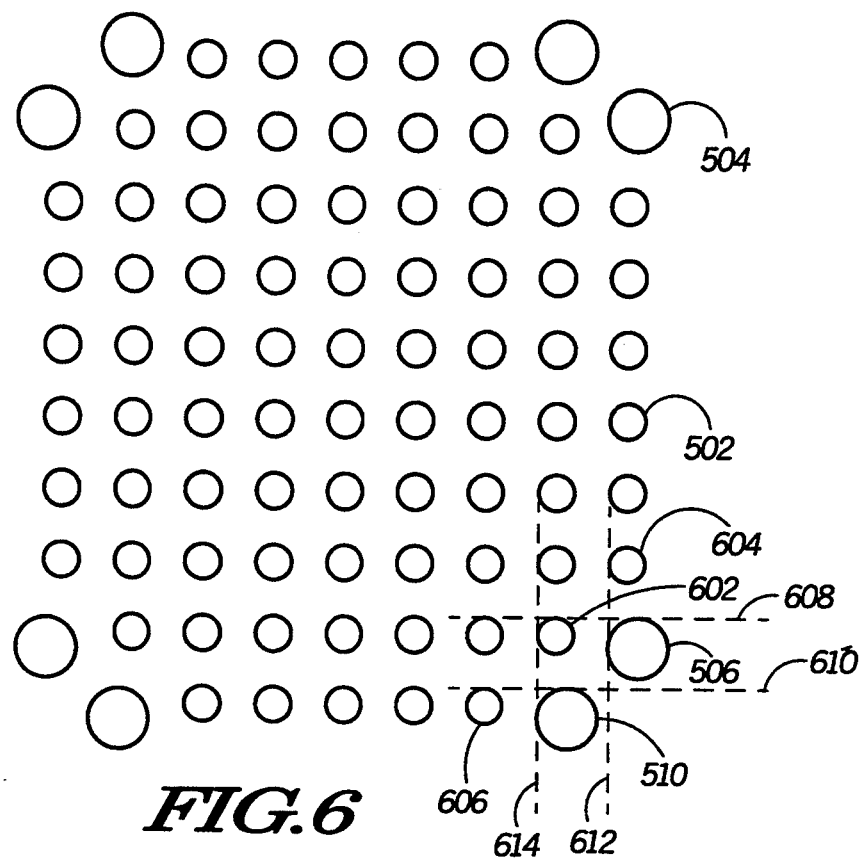
FIG. 6 is a top view of the circuit supporting substrate and array of electrical contacts of FIG. 5, according to the preferred embodiment of the present invention.

FIG. 6 is a top view of the circuit supporting substrate 202 and pad array 502 of FIG. 5, according to the preferred embodiment of the present invention. This pad array 502 is organized in a linear grid fashion as shown.

Preferably, eight corner pads are selected to be the aligning pads 506 in the pad array 502. However, other numbers of aligning pads may be effective for aligning a component with a circuit supporting substrate. For example, four corner pads provided relatively good alignment properties. Even one aligning pad on the circuit supporting substrate, paired with its corresponding aligning pad on the component, can be sufficient for providing aligning force to move the component relative to the circuit supporting substrate for guiding the two into alignment with each other.

These eight aligning pads 506 can be paired with leads on the component that will interconnect electrical signals between the component and the circuit supporting substrate. Alternatively, the aligning pads 506 can be paired with leads on the component that do not interconnect signals.

Preferably, each aligning pad 506 is arranged relative to the pad array 502 such that a tangential line 608 can be drawn between the innermost point of the aligning pad 506 and the inner most point of the other pads 602 that are substantially collinear on the grid. By arranging the aligning pad 506 relative to the other pads 604 on the grid such that a line 612 can connect their inner most points, the larger aligning pad 506 will be off center relative to the smaller pads 604 on the grid and the outer most point of the aligning pad 506 will extend further out than the outer most points of the smaller pads 604 on the grid. In this way, the aligning pads 506, 510, preferably located about the perimeter of the pad array, provide that at least one aligning pad 506 and its paired lead on the component will at least partially overlap relative to the larger tolerance of the placement operation. At the same time, the smaller pads 604 of the pad array 502 can be spaced apart using a much finer pitch which corresponds to a smaller tolerance, i.e., a tighter tolerance, for the placement operation. Hence, the tolerance of the placement operation can be significantly relaxed even while implementing much finer pitch spacing for the smaller pads 604 on the pad array. Of course, the finer pitch spacing of the pads in the pad array permits increasing the number of pads that can be interconnecting between the component and the circuit supporting substrate. Additionally, this self aligning feature of the pads to the larger tolerance of the placement operation makes the manufacturing process more efficient, reduces the cost of manufacturing, and increases the quality of the final delivered product. Also, because the tolerance of the placement operation is significantly increased by the self-aligning pad array arrangement, the placement operation can be performed by less sophisticated and less expensive placement equipment. The placement operation can even be simplified to a manual placement of the component on the circuit supporting substrate.

Figure 7:
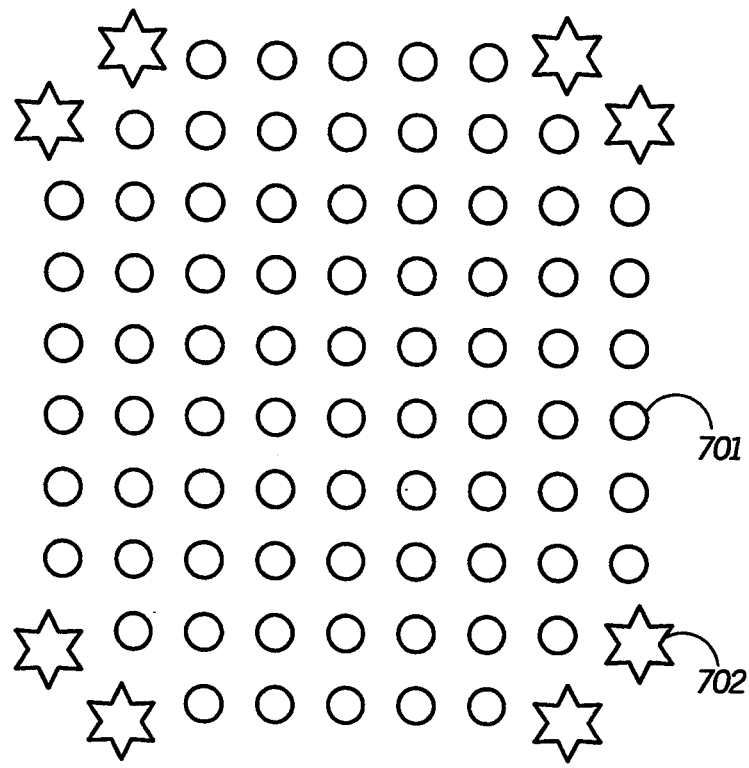
FIG. 7 is a top view of an array of electrical contacts on a circuit supporting substrate including aligning pads dimensioned as six-pointed stars, according to the present invention.

FIG. 7 is a top view of a pad array 701 on a circuit supporting substrate including aligning pads 702 dimensioned as six-pointed stars, according to the present invention. Alternative dimensioning of the aligning pads 702, as shown, is possible within the scope of the present invention. For example, the aligning pads 702 can be dimensioned in circular shape, oval shape, rectangular shape, and other dimensions that can also accomplish the realigning function, as will be more fully discussed below.

Figure 8:
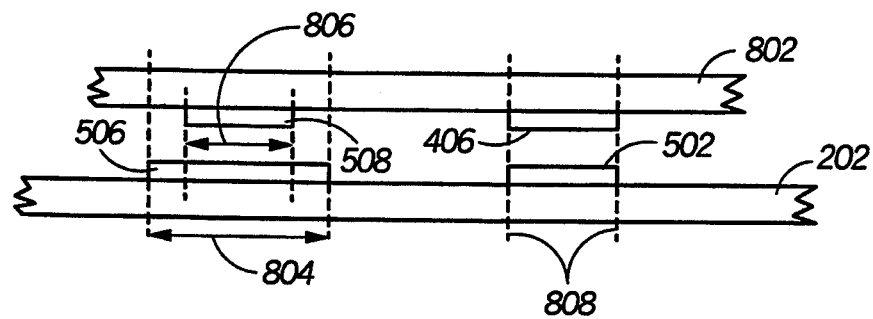
FIGS. 8, 9, and 10 are side views of a circuit supporting substrate having a pad array thereon and a surface mount component being aligned with the pad array, according to the preferred embodiment of the present invention.
Figure 9:
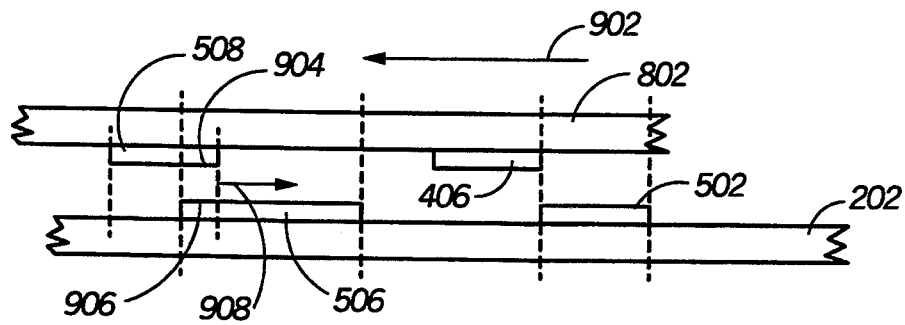
Figure 10:
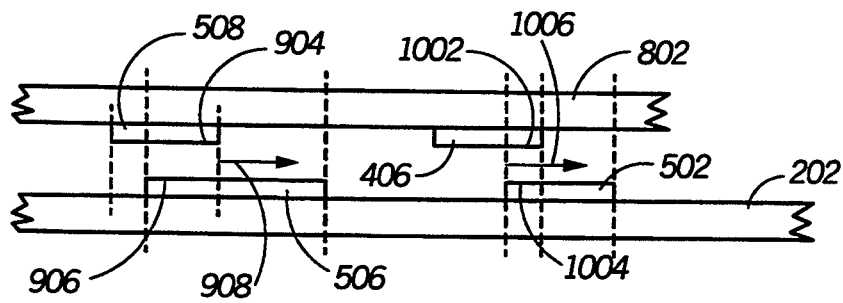

FIG. 8 is a side view of the circuit supporting substrate 202 having the pad array 502 disposed on a surface 308 of the circuit supporting substrate 202, and a surface mount component 802 being in alignment with the pad array 502, according to the preferred embodiment of the present invention. FIGS. 9 and 10 illustrate how the pad array 502 can be placed relative to a larger tolerance of the placement operation, and then operates to self-align the component to the placement location relative to the tighter tolerance of the placement operation, according to the preferred embodiment of the present invention.

Referring to FIG. 8, the component 802 is aligned to the location on the circuit supporting substrate 202, as indicated by the overlapping area 808 of the pad array 406 on the component 802 relative to the pad array 502 on the circuit supporting substrate 202. The alignment pad 506 on the surface 308 of the circuit supporting substrate 202 is dimensioned larger 804 than the aligning pad 508 on the opposing surface 801 of the component 802. The smaller 806 aligning pad 508 on the component 802 is shown overlapping the larger 804 aligning pad 506 on the circuit supporting substrate 202. Without the aligning pad 506 the tolerance of a placement operation for the component 802 is defined by the overlap area 808 of the pad arrays 406, 502. By dimensioning and arranging the aligning pads 506, 508, relative to each other the tolerance of the placement operation is significantly increased. Self-alignment can be effected by at least one pair of overlapping aligning pads 506, 508. The tolerance of the placement operation can be defined in at least one axis on a plane that is substantially parallel to the opposing surfaces 308, 801, of the circuit supporting substrate 202 and the component 802.

Referring to FIG. 9 and 10 the component 802 is placed on the circuit supporting substrate 202 being misaligned 902 to the desired location on the circuit supporting substrate 202. This is clearly indicated by the pad array 406 not overlapping the pad array 502. Hence, the component 802 is placed on the circuit supporting substrate 202 relative to a tolerance of the placement operation that is greater than the maximum tolerance allowed by the overlapping pad arrays 406, 502. As can be seen, the aligning pad 508 on the component 802 shares an overlapping area 904, 906, with the alignment pad 506 on the circuit supporting substrate 202. The aligning pad 506 on the circuit supporting substrate 202 is oriented relative to the aligning pad 508 on the component 802 such that when the solder is liquid, such as during the reflow operation, the surface tension of the liquid solder applies a force 908 between the component 802 and the circuit supporting substrate 202 that can move the component 802 relative to the circuit supporting substrate 202 in the direction shown by the arrow 908. This tends to bring back the component into alignment with the desired location on the circuit supporting substrate 202. Referring to FIG. 10, as the component 802 continues to move relative to the circuit supporting substrate 202 as indicated by the arrow 908, the pad arrays 406, 502, begin to overlap with each other, as indicated by the overlap areas 1002, 1004, which provides additional force 1006 for moving the component 802 into alignment with the location on the circuit supporting substrate 202. Therefore, by providing at least one pair of aligning pads 508, 506, as shown, the component 802 can be placed on the circuit supporting substrate 202 relative to a tolerance of the placement operation that is greater (more lenient) than the tolerance of the placement operation without the aligning pads 508, 506.

Figure 11:
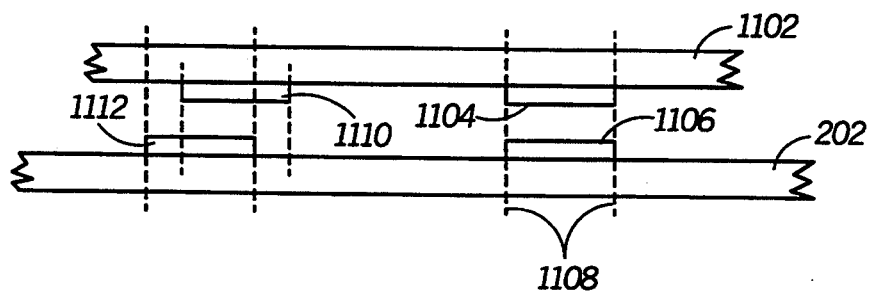
FIGS. 11, 12, and 13 are side views of a circuit supporting substrate having a pad array thereon and a surface mount component being aligned with the pad array, according to an alternative embodiment of the present invention.
Figure 12:
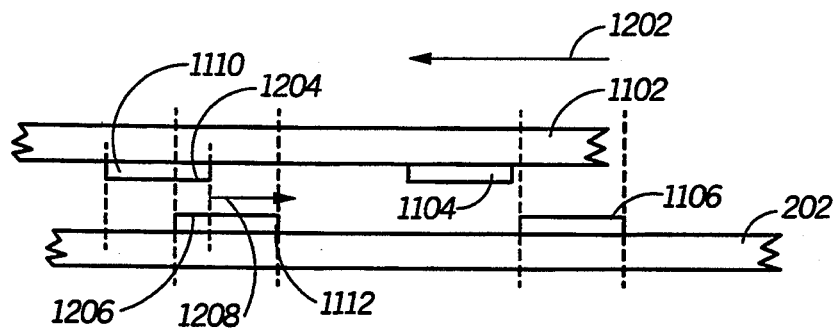
Figure 13:
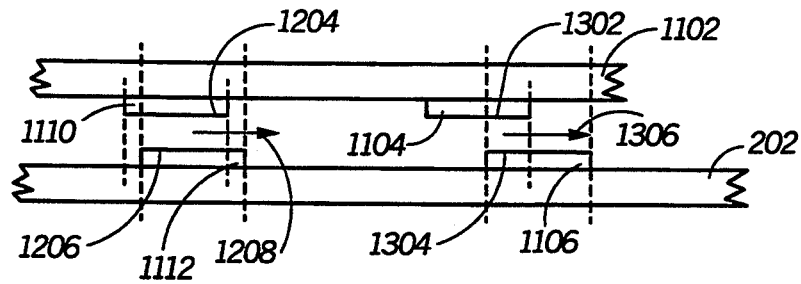

FIG. 11 is a side view of the circuit supporting substrate 202 having a pad array 1106 disposed thereon and a surface mount component 1102 being in alignment with the pad array 1106, according to an alternative embodiment of the present invention. FIGS. 12 and 13 illustrate how the component 1102 can be placed on the pad array 1106 relative to a larger tolerance of the placement operation, and then during reflow the aligning pads 1110, 1112, operate with the liquid solder to align the component to the desired location relative to the tighter tolerance of the placement operation, according to an alternative embodiment of the present invention.

Referring to FIG. 11, a pad array 1104 on the component 1102 is aligned with a pad array 1106 on the circuit supporting substrate 202. The alignment is indicated by the overlap region 1108. An aligning pad 1110 on the component 1102 is paired with an aligning pad 1112 on the circuit supporting substrate 202. Referring to FIG. 12, the component 1102 is placed on the circuit supporting substrate 202 in relative misalignment 1202, as indicated by the non-overlapping pad arrays 1104, 1106. However, the alignment pads 1110, 1112, share a common overlapping region 1204, 1206, within a tolerance of the placement operation. During reflow, the surface tension of the liquid solder between the overlapping region 1204, 1206, of the aligning pads 1110, 1112, tends to move and guide the component 1102 relative to the circuit supporting substrate 202 into alignment, the direction of motion being indicated by the arrow 1208. Referring to FIG. 13, the component 1102 continues to move relative to the circuit supporting substrate 202 until the pad array 1104 on the component 1102 at least partially overlaps the pad array 1106 on the circuit supporting substrate 202, as indicated by the overlapping region 1302, 1304. The surface tension of the liquid solder in the overlapping region 1302, 1304, of the pad arrays 1104, 1106, provides additional aligning force 1306 for moving the component 1102 relative to the circuit supporting substrate 202 and into alignment.

Normally the aligning pads 1110, 1112, tend to want to center themselves to each other. However, when the pad arrays 1104, 1106 begin to overlap with each other, as shown by the overlap region 1302, 1304, the additional force 1306 can move the component 1102 into alignment with the location on the circuit supporting substrate 202 even beyond the point where the aligning pads 1110, 1112, are centered to each other. Hence, once the pad arrays 1104, 1106, are overlapping with each other the component 1102 tends to continue to move relative to the circuit supporting substrate 202 until the pad arrays 1104, 1106, are aligned with each other. The final alignment of the pad arrays 1104, 1106, is illustrated in FIG. 11.

Figure 14:
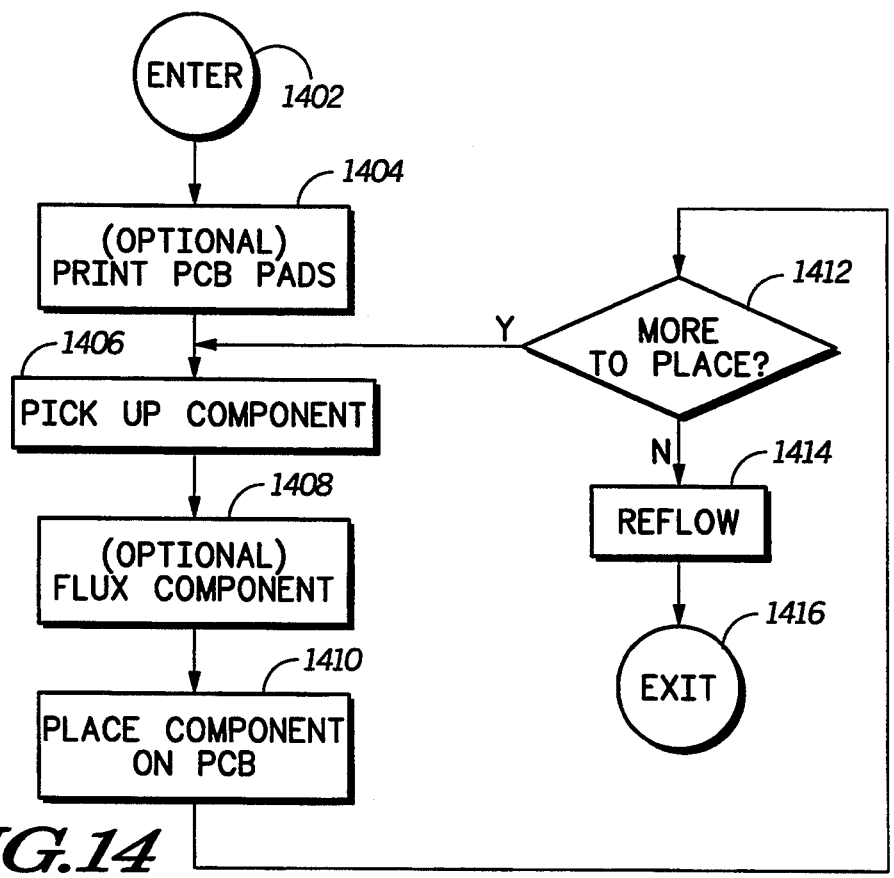
FIG. 14 is a flow diagram illustrating a manufacturing process sequence for placing and aligning components on a circuit supporting substrate, in accordance with the present invention.

FIG. 14 is a flow diagram illustrating a manufacturing process sequence for placing and aligning components on the circuit supporting substrate 202, in accordance with the present invention. This manufacturing process, as discussed earlier, can use automatic placement equipment, robotic placement equipment, or even manual placement of components on the circuit supporting substrate 202. Because the tolerance of the placement operation is significantly relaxed due to the dimensioning and arrangement of the aligning pads, the manufacturing process can become more efficient at the current level of automation.

Optionally, solder may be initially applied 1402, 1404 to the pads on the circuit supporting substrate, e.g., the printed circuit board (PCB) 202. This may be useful when the components to be placed are not pre-soldered, or when additional soldering material is to be added to already soldered components during surface mounting. Then, for example, in a robotic or manual placement operational sequence, each component is picked up 1406 and subsequently placed 1410 on the desired location on the circuit supporting substrate 202, e.g., the printed circuit board (PCB), relative to the greater tolerance provided by using the aligning pads, as discussed earlier.

Optionally, if the components are pre-bumped with solder, i.e., solder being pre-applied to the pads on the component, then after picking up the component 1406 the component can be fluxed 1408 and then placed 1410 on the circuit supporting substrate 202. On the other hand, if the components are not pre-bumped with solder then the fluxing step 1408 can be omitted. Of course, in this case, the pads on the circuit supporting substrate 202 have solder pre-applied to them in step 1404.

The pick and place operation continues 1412 for as long as there are more components to be placed. Once all components have been placed 1412 on the circuit supporting substrate 202 the circuit supporting substrate is reflowed 1414, such as in a reflow oven. However, alternatively, a localized heat source can be applied to individual surface mounted components for localized reflowing of individual components.

When the solder turns liquid in the reflow operation 1414, the pad arrays on the components and the surface of the circuit supporting substrate 202 will self align to at least partially overlap with each other relative to the tighter tolerance of the placement operation. After fellow 1414, the circuit supporting substrate 202 with the surface mounted components may undergo post-soldering operations 1416 and then continue on to subsequent manufacturing and assembly of the electronic device.

Additionally, as may be appreciated by those skilled in the art, other conductive bonding mediums besides solder can be used between the pad arrays, possibly without requiring the reflow operation 1414. It is important that the surface tension of a liquefied conductive bonding medium is sufficiently strong to move the component relative to the circuit supporting substrate 202. For example, a conductive epoxy may serve a similar purpose as the solder. In such an alternative, the manufacturing process may avoid having to apply heat to the components and the circuit supporting substrate, and thus further streamline the efficiency of the overall manufacturing process.

Thus, the self-aligning electrical contacts discussed above significantly improve the reliability of placement of the component on the circuit supporting substrate. Consequently, manufacturing defects are significantly reduced, and consequently the quality of the product is improved, even while utilizing fine pitch interconnection that approaches the limit of the manufacturing technology.

What is claimed is:

1. A mounting pad arrangement for improved reliability of placement of a surface mount component with respect to the mounting pad arrangement, the mounting pad arrangement comprising:
   a circuit supporting substrate having an interconnection surface;
   a first pad array disposed throughout an area of predetermined shape on said interconnection surface, said area having four outside corners, the first pad array comprising:
      a plurality of contact pads arranged in a first linear grid pattern; and
      eight aligning pads, larger than the contact pads, two of the aligning pads positioned proximate each of said four outside corners, each of the aligning pads further positioned off center with respect to the first linear grid pattern such that a tangential line can be drawn between an innermost point of the aligning pad and corresponding innermost points of the contact pads that are collinear on the first linear grid pattern;
   a second pad array disposed on the surface mount component and arranged in a second linear grid pattern that aligns with the first linear grid pattern, eight pads of the second pad array also aligning with points of intersection of the first linear grid pattern that fall within each of the eight aligning pads, each pad of the second pad array being equal in size to any other pad of the second pad array; and
   solder disposed between and contacting each pad of the first and second pad arrays.

2. The mounting pad arrangement according to claim 1, wherein at least a portion of the contact pads and the aligning pads are electrically coupled to circuitry within the surface mount component.

3. An electronic device, comprising:
   electronic circuitry for performing functions in the electronic device;
   a circuit supporting substrate having an interconnection surface, at least a portion of the electronic circuitry comprising a surface mount component mounted on said interconnection surface;
   a first pad array for improved reliability of placement of the surface mount component with respect to the first pad array, the first pad array disposed throughout an area of predetermined shape on said interconnection surface, said area having four outside corners, the first pad array comprising:
      a plurality of contact pads arranged in a first linear grid pattern; and
      eight aligning pads, larger than the contact pads, two of the aligning pads positioned proximate each of said four outside corners, each of the aligning pads further positioned off center with respect to the first linear grid pattern such that a tangential line can be drawn between an innermost point of the aligning pad and corresponding innermost points of the contact pads that are collinear on the first linear grid pattern;
   a second pad array disposed on the surface mount component and arranged in a second linear grid pattern that aligns with the first linear grid pattern, eight pads of the second pad array also aligning with points of intersection of the first linear grid pattern that fall within each of the eight aligning pads, each pad of the second pad array being equal in size to any other pad of the second pad array; and
   solder disposed between and contacting each pad of the first and second pad arrays.

4. The electronic device according to claim 3, wherein at least a portion of the contact pads and the aligning pads are electrically coupled to circuitry within the surface mount component.

5. A selective call receiver, comprising:
   receiver circuitry for receiving transmitted messages;
   a decoder electrically coupled to the receiver circuitry for decoding the received messages;
   presenting means electrically coupled to the decoder for presenting the decoded messages to a user;
   a circuit supporting substrate having an interconnection surface, wherein at least a portion of the receiver circuitry, the decoder, and the presenting means includes a surface mount component mounted on said interconnection surface;
   a first pad array that improves reliability of placement of the surface mount component with respect to the first pad array, the first pad array disposed throughout an area of predetermined shape on said interconnection surface, said area having four outside corners, the first pad array comprising:
      a plurality of contact pads arranged in a first linear grid pattern; and
      eight aligning pads, larger than the contact pads, two of the aligning pads positioned proximate each of said four outside corners, each of the aligning pads further positioned off center with respect to the first linear grid pattern such that a tangential line can be drawn between an innermost point of the aligning pad and corresponding innermost points of the contact pads that are collinear on the first linear grid pattern;
   a second pad array disposed on the surface mount component and arranged in a second linear grid pattern that aligns with the first linear grid pattern, eight pads of the second pad array also aligning with points of intersection of the first linear grid pattern that fall within each of the eight aligning pads, each pad of the second pad array being equal in size to any other pad of the second pad array; and
   solder disposed between and contacting each pad of the first and second pad arrays.

6. The selective call receiver according to claim 5, wherein at least a portion of the contact pads and the aligning pads are electrically coupled to circuitry within the surface mount component.

* * * * *